United States Patent
Horng et al.

(10) Patent No.: US 8,026,186 B2
(45) Date of Patent: Sep. 27, 2011

(54) MICROWAVE ANNEALING METHOD FOR DEVICE PROCESSING WITH PLASTIC SUBSTRATE

(75) Inventors: Sheng-Fu Horng, Hsinchu (TW);
Jen-Chun Wang, Hsinchu (TW);
Tse-Pan Yang, Hsinchu (TW);
Ming-Kun Lee, Hsinchu (TW);
Tarng-Shiang Hu, Chutung Township, Hsinchu County (TW); Hsin-Fei Meng, Hsinchu (TW)

(73) Assignee: National Tsing Hua University, Hsin Chu (TW)

( * ) Notice: Subject to any disclaimer, the term of this patent is extended or adjusted under 35 U.S.C. 154(b) by 0 days.

(21) Appl. No.: 12/899,206

(22) Filed: Oct. 6, 2010

(65) Prior Publication Data
US 2011/0151646 A1  Jun. 23, 2011

(30) Foreign Application Priority Data
Dec. 18, 2009 (TW) ................................ 98143765 A

(51) Int. Cl.
*H01L 21/31* (2006.01)
*H01L 21/469* (2006.01)

(52) U.S. Cl. ................... 438/781; 438/99; 257/E25.009; 257/E23.064; 257/E23.176

(58) Field of Classification Search ............... 438/99, 438/780, 781, FOR. 135, FOR. 407; 257/E25.009, 257/E23.064, E23.176
See application file for complete search history.

(56) References Cited

U.S. PATENT DOCUMENTS

| 6,653,027 B2 * | 11/2003 | Angelopoulos et al. ........ 430/5 |
| 2010/0203454 A1 * | 8/2010 | Brongersma et al. ......... 430/311 |

* cited by examiner

*Primary Examiner* — Michelle Estrada
(74) *Attorney, Agent, or Firm* — Muncy, Geissler, Olds & Lowe, PLLC

(57) ABSTRACT

The present invention provides a microwave annealing method for a plastic substrate. The method comprises pulsed microwave annealing to an organic photo-voltaic device to avoid warpage and degradation of the plastic substrate. Utilizing pulsed microwave annealing method can improve the wettability of the organic layer on the plastic substrate verified by contact angle measurement, and achieving the organic solar cell fabricated with higher power conversion efficiency.

17 Claims, 3 Drawing Sheets

MICROWAVE ANNEALING METHOD FOR DEVICE PROCESSING WITH PLASTIC SUBSTRATE

BACKGROUND

1. Field of the Invention

This invention relates to a process for an organic photovoltaic device, and more particularly to a microwave annealing method for plastic substrates.

2. Description of the Prior Art

Most of the electric devices (for example, LEDs, transistors, solar cells) are fabricated on silicon wafers or glass substrates with high temperature resistant. The applications of the substrates have many constraints due to hardness and unyielding property of the substrate. Therefore, an organic electron material with relatively low processing temperature as an active layer material may be easily fabricated on a plastic substrate to achieve the advantages of light-weightiness, low processing temperature and flexibility electric device, and thereby various organic electron devices having widely used.

With the technical development, some electric devices may be made by an organic material, for example organic thin film transistor (OTFT). In comparison with the conventional inorganic transistor, organic thin film transistors may be made at low temperature, and therefore the processed substrate may be selected by light-weightiness, thinner and low cost plastic substrates replacing glass substrates. Moreover, the organic thin film transistors have simply fabricating process by printing method for patterning an organic film to reach the purpose of reducing mask number and without vacuum deposition equipment. The process of fabricating an organic thin film transistor on a plastic substrate is compatible with a roll to roll process, and therefore it has a great benefit of reducing the manufacturing cost.

Recently, because conjugated polymer semiconductors exhibit many advantages such as cost-effectiveness and feasibility to scale up, their applications in organic light-emitting diodes, organic thin-film transistors and organic solar cells have been intensively studied. When fabricated on plastic substrates, further advantages such as flexibility, light-weightiness, easy to carry, not easy to break can be obtained. Furthermore, because of the flexibility, continuous roll-to-roll processing may be employed to lower the processing cost and increase the throughput. However, because of the constraints of plastic substrates such as glass transition temperature and high coefficient of thermal expansion, the processing temperature need to be limited to low temperature, for otherwise warpage and degradation may result. Therefore, how to achieve effective annealing at reduced temperature is imperative.

Currently, processing of most of the organic devices is used to hot-plate annealing to improve the performance of the organic devices. However, hot-plate annealing the organic devices fabricated on the plastic substrates will create negative impact, for example, warpage and degradation of the plastic substrates to cause adverse effects for the subsequent process. Moreover, hot-plate annealing exhibits much higher energy loss and low efficiency of energy usage.

In view of the aforementioned drawbacks, the present invention provides an improved method for solving issues of warpage and degradation of the substrates and negative impact caused by hot-plate annealing.

SUMMARY OF THE INVENTION

An objective of the present invention is to provide a pulsed microwave annealing method applied to a plastic substrate, which utilizes the pulsed microwave annealing method to gain a better surface wettability for facilitating film-forming to avoid the plastic substrate influenced by heating effect in a fabricating process.

Another objective of the present invention is to provide a microwave annealing method applied to plastic substrates, which utilizes the microwave annealing method for annealing organic electric devices on the plastic substrates for facilitating the plastic substrate free of warpage or deformation.

The characteristic of the present invention is continuous microwave annealing in process to pulse a conductive layer of a plastic substrate cracking, and therefore the present utilizes a pulsed microwave annealing for facilitating to avoid the conductive layer cracking.

An aspect of the present invention is a microwave annealing method for a plastic substrate, comprising providing a flexible substrate; forming an electron-hole transport layer over the flexible substrate; and performing pulsed microwave annealing to the electrode-hole transport layer.

The flexible substrate has a conductive film plated thereon. Material of the electron-hole transport layer is poly(3,4 ethylenedioxythiophene) poly(styrenesulfonate) and related derivatives.

The method further comprises a step of forming an active layer on the electron-hole transport layer after the performing pulsed microwave annealing. The active layer is formed poly (3-hexyl thiophene) as a donor and [6,6]-phenyl-C61-butyric acid methyl ester as an acceptor. The method further comprises a second pulsed microwave annealing to the active layer, and further comprising a step of forming an electrode on said active layer.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

The present invention relates to organic electric (photovoltaic) devices which include LEDs, transistors, solar cells and biosensors, etc. Polymer LEDs fabricated by the present invention's method exhibits an outstanding result. Besides, to exert flexibility of flexible materials and reduce processing cost, the organic electric devices of the present invention are fabricated on flexible plastic substrates.

In the present invention, microwave (oven) annealing is used to replace traditional hot-plate annealing to avoid warpage and degradation of the plastic substrates created by processing temperature and further impacting device characteristic. Furthermore, it is justified by contact angle measurements that microwave annealing of the present invention may improve the wettability than that of the traditional hot-plate annealing for facilitating subsequent processing and device characteristic. As an example, it is found that the organic solar cells fabricated with microwave annealing exhibit much higher power conversion efficiency than that of the conventional hot-plate annealing. The microwave annealing method will also found applications in the fabrication of other type of organic electric devices, for example organic LEDs, organic thin film transistors.

The method of the present invention is used for microwave annealing to replace traditional hot-plate annealing to avoid the plastic substrates directly heating to change device characteristic. Furthermore, it is justified by the experiment that the solar cells fabricated with microwave annealing of the present invention may improve the performance of the solar cell device than that of the traditional hot-plate annealing. In other words, the organic solar cells fabricated by method of the present invention may improve power conversion efficiency of the organic solar cells.

Conjugated polymer semiconductors exhibit easy to fabricate, light-weightiness and allowably forming on plastic substrates such that it has been intensively developed. To achieve optimal power conversion efficiency of the organic solar cells, annealing processes should be introduced. However, because flexible substrates exhibit low glass transition temperature and coefficient of thermal expansion higher than that of glass substrates, deformation of the flexible substrates by heating may result. Therefore, there is no doubt that microwave annealing allowably for flexible substrates applied to the present invention is the key process.

Figure 1:
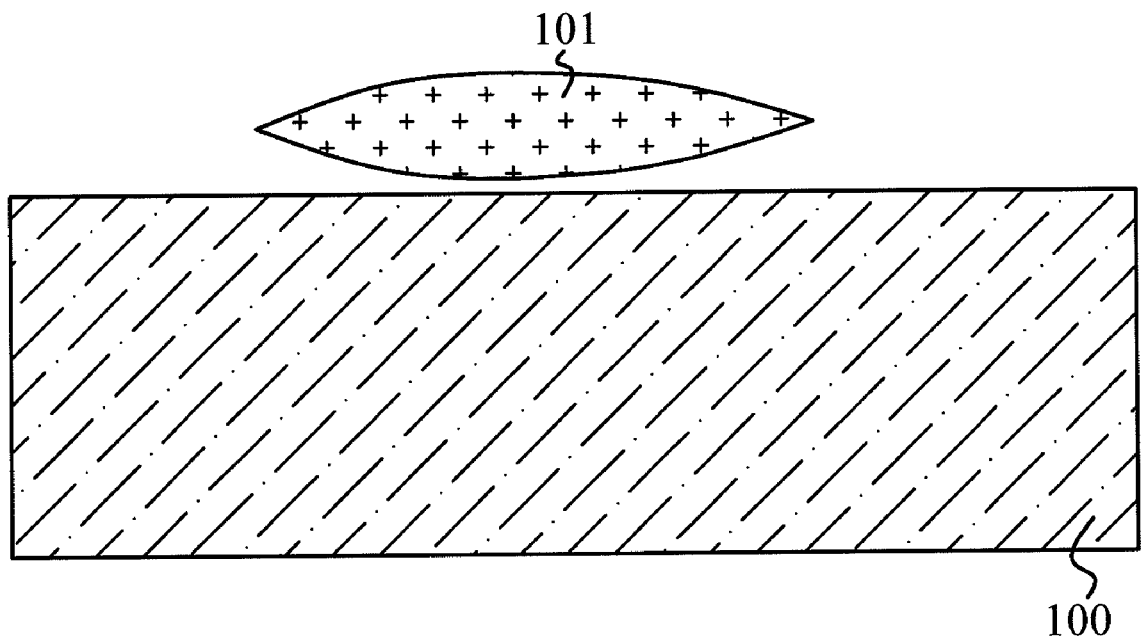
FIG. 1 shows a contact angle of a thin film structure by utilizing a hot-plate annealing.
Figure 2:
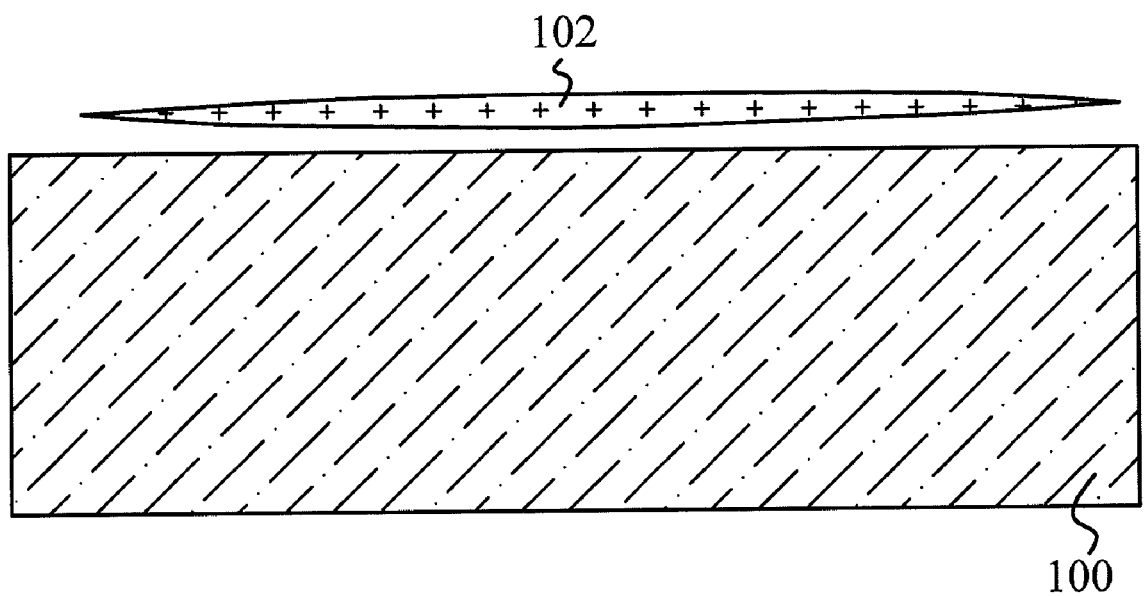
FIG. 2 shows a contact angle of a thin film structure by utilizing a microwave annealing according to the present invention.

Referring to FIG. 1, it shows a contact angle of a thin film structure 100 by utilizing a hot-plate annealing. By contrast, a contact angle of a thin film structure 100 by utilizing microwave annealing is shown in FIG. 2. The difference of surface characterization of the thin film structure 100 of an organic solar cell may be analyzed by contact angle created by hot-plate annealing and microwave annealing. The thin film structure 100 is for example, an electron-hole transport layer of an organic solar cell. The contact angle 102, shown in FIG. 2, created by the microwave annealing is greatly smaller than contact angle 101, shown in FIG. 1, created by the hot-plate annealing. Due to larger contact angle created by the hot-plate annealing, it is disadvantageous for subsequent thin film forming process.

Figure 3:
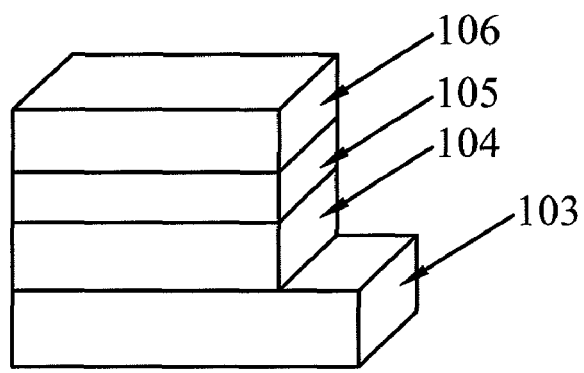
FIG. 3 is a diagram of an organic solar cell structure.

In one embodiment, FIG. 3 shows a diagram of an organic solar cell structure. The organic solar cell structure includes a bottom flexible substrate 103. The flexible substrate 103 is for example, a flexible substrate 103 with plating a conductive film formed thereon. The conductive film may be Indium tin oxide (ITO). An electron-hole transport layer 104 is formed on the flexible substrate 103. For example, material of the electron-hole transport layer 104 may be poly(3,4 ethylenedioxythiophene):poly(styrenesulfonate), i.e. PEDOT:PSS, and related derivatives. Subsequently, an active layer 105 is formed on the electron-hole transport layer 104. The active layer 105 may be formed by a donor (poly(3-hexyl thiophene), P3HT) and an acceptor ([6,6]-phenyl-C61-butyric acid methyl ester PCBM). A metal electrode 106 is formed on the active layer 105.

Figure 4:
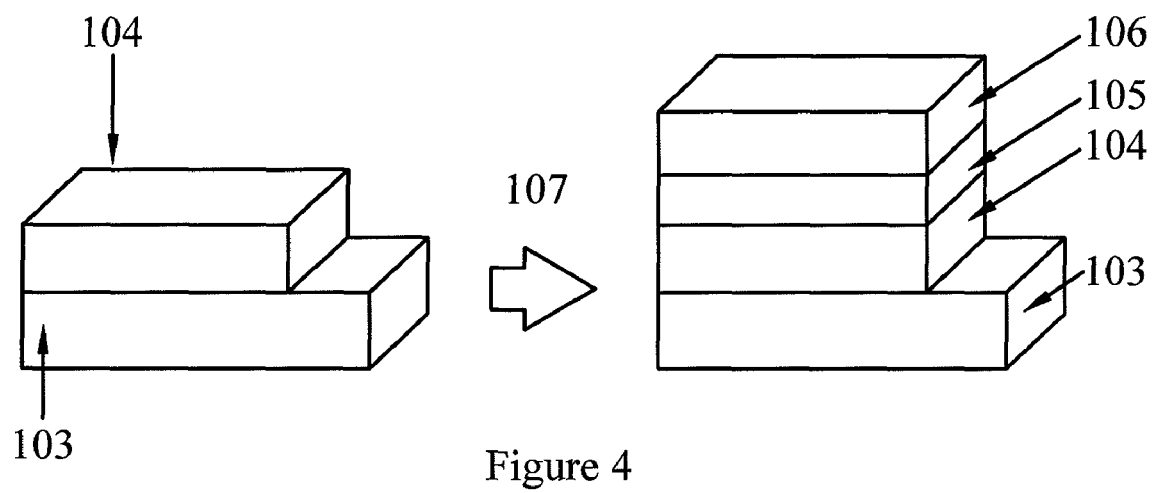
FIG. 4 is a diagram of microwave annealing to the electron-hole transport layer according to the present invention.

To develop a suitably annealing for plastic substrates, for example organic solar cells, it is found that the electron-hole transport layer 104 annealed by the hot-plate annealing may result in disadvantageous for the subsequent film-forming of the active layer 105 and further impact performance of the organic solar cells. Especially, fill factor of solar cells will be reduced, and it can not be completely avoided even reducing annealing temperature. To enhance power conversion efficiency of solar cells, the present invention provides microwave annealing process. The microwave annealing process 107 may anneal the electron-hole transport layer 104, shown in FIG. 4. In one embodiment, microwave of the present invention is in a specified range frequency such that thin film can substantially absorb the energy within the specified range frequency. However, the flexible substrate 103 can not substantially absorb the energy within the specified range frequency. In one embodiment, the microwave annealing process 107 is pulsed microwave annealing 107, wherein process parameters are pulse frequency about 2.0~4.0 GHz, power smaller 500 W, heating time 1~60 sec/per and heating time interval 5~500 sec/per. Then, the active layer 105 is then formed on the electron-hole transport layer 104 after annealing. It is found by experiment results of the FIGS. 1 and 2 that film-forming of the active layer 105 fabricated with pulsed microwave annealing to the electron-hole transport layer 104 of the present invention may improve the performance of the solar cell device than that of the hot-plate annealing to the electron-hole transport layer 104.

Figure 5:
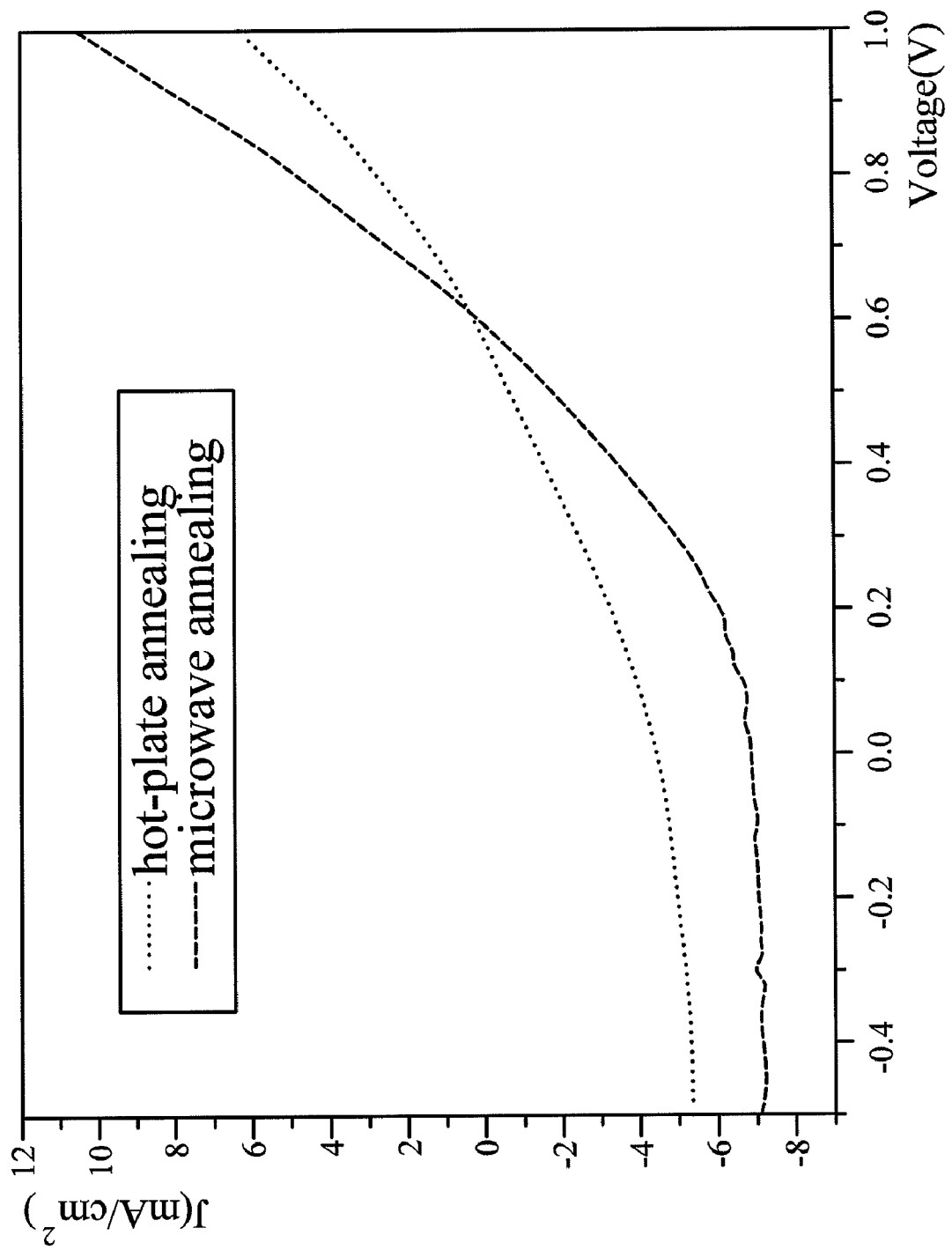
FIG. 5 is a photovoltaic effect of microwave annealing of the present invention and the hot-plate annealing.

In one embodiment, in organic solar cells fabricating process, annealing process is introduced to form an electron-hole transport layer and an active layer. In the present invention, after forming the electron-hole transport layer and after forming the active layer may perform a microwave annealing process, respectively. The photovoltaic effect of microwave annealing of the present invention and hot-plate annealing is shown in FIG. 5. Referring to FIG. 5, performance of the organic solar cells may be improved greatly.

From above-mentioned, surface annealed of the electron-hole transport layer by the microwave annealing of the present invention is advantageous for the subsequent film-forming of the active layer. Moreover, to reduce continuous microwave damaging to conductive layer of the flexible substrate, the present provides a pulsed microwave annealing without damaging to the conductive layer. Utilizing pulsed microwave annealing, energy absorbed by the conductive layer may release to avoid its cracking in the annealing process. The pulsed microwave annealing may be performed to extremely enhance performance of the organic solar cells on the flexible substrate. The pulsed microwave annealing may be utilized not only in fabricating organic solar cells on the flexible substrate, but also in fabricating other type organic semiconductor devices. In the future, the pulsed microwave annealing should be a potentially fabricating process.

To summarize, the present invention utilizes a well-developed semiconductor film-forming technique and fundamental theorem, combining with the pulsed microwave annealing method to successfully fabricate organic electric devices on flexible substrates. And, pulsed microwave annealing method of the present invention exhibits many advantages such as rapid, non-contact and without damaging the substrate, and therefore the pulsed microwave annealing should be a potentially fabricating method in the future.

From above discussion, a microwave annealing method of the present invention applied to plastic substrates exhibits the above-mentioned advantages and features, and it is justified by the experiment data that utilizing method of the present invention may extremely enhance the performance of organic solar cells. Therefore, the present invention has an un-expected result from prior arts due to its outstanding performance.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A microwave annealing method for a plastic substrate, comprising
   providing a flexible substrate;
   forming an electron-hole transport layer over said flexible substrate; and
   performing pulsed microwave annealing to said electrode-hole transport layer.

2. The method of claim 1, wherein said flexible substrate has a conductive film plated thereon.

3. The method of claim 1, wherein said flexible substrate is a plastic substrate.

4. The method of claim 1, wherein material of said electron-hole transport layer is poly(3,4 ethylenedioxythiophene):poly(styrenesulfonate) and related derivatives.

5. The method of claim 1, wherein pulse frequency of said pulsed microwave annealing is about 2.0~4.0 GHz.

6. The method of claim 1, wherein power of said pulsed microwave annealing is smaller than 500 W.

7. The method of claim 1, wherein heating time of said pulsed microwave annealing is 1~60 sec/per.

8. The method of claim 1, wherein heating time interval of said pulsed microwave annealing is 5~500 sec/per.

9. The method of claim 1, further comprising a step of forming an active layer on said electron-hole transport layer after said performing pulsed microwave annealing.

10. The method of claim 9, wherein said active layer is formed of poly(3-hexyl thiophene) as a donor and [6,6]-phenyl-C61-butyric acid methyl ester as an acceptor.

11. The method of claim 9, further comprising a second pulsed microwave annealing to said active layer.

12. The method of claim 11, wherein pulse frequency of said second pulsed microwave annealing is about 2.0~4.0 GHz.

13. The method of claim 11, wherein power of said second pulsed microwave annealing is smaller than 500 W.

14. The method of claim 11, wherein heating time of said second pulsed microwave annealing is 1~60 sec/per.

15. The method of claim 11, wherein heating time interval of said second pulsed microwave annealing is 5~500 sec/per.

16. The method of claim 9, further comprising a step of forming an electrode on said active layer.

17. The method of claim 16, wherein the electrode is a metal electrode.

* * * * *